United States Patent [19]

Roche et al.

[11] 4,310,362
[45] Jan. 12, 1982

[54] METHOD OF MAKING SCHOTTKY DIODE WITH AN IMPROVED VOLTAGE BEHAVIOR

[75] Inventors: Marcel Roche; Jean P. Litot, both of Paris, France

[73] Assignee: Thomson-CSF, Paris, France

[21] Appl. No.: 161,571

[22] Filed: Jun. 20, 1980

[30] Foreign Application Priority Data

Jun. 22, 1979 [FR] France ............................. 79 16056

[51] Int. Cl.³ .................... H01L 29/48; H01L 29/56; H01L 29/90
[52] U.S. Cl. ..................................... 148/1.5; 357/15; 357/91; 427/84
[58] Field of Search .......................... 148/1.5; 427/84; 357/15, 91

[56] References Cited

U.S. PATENT DOCUMENTS

| | | | |
|---|---|---|---|
| 3,541,403 | 11/1970 | Lepselter et al. | 317/234 |
| 4,063,964 | 12/1977 | Peressini et al. | 148/1.5 |
| 4,089,020 | 5/1978 | Ikeda et al. | 357/15 |
| 4,096,622 | 6/1978 | McIver | 29/578 |
| 4,110,775 | 8/1978 | Festa | 357/15 |
| 4,149,174 | 4/1979 | Shannon | 357/13 |
| 4,149,905 | 4/1979 | Levinstein et al. | 148/1.5 |
| 4,202,002 | 5/1980 | De La Moneda | 357/22 |

OTHER PUBLICATIONS

Battista et al., IBM-TDB, 18 (1976) 3229.
Brack et al., IBM-TDB, 19 (1976) 2592.

*Primary Examiner*—Upendra Roy
*Attorney, Agent, or Firm*—Cushman, Darby & Cushman

[57] ABSTRACT

The voltage behaviour of a Schottky diode is improved by providing a Schottky diode of the type comprising an epitaxial layer locally covered with a metal layer and by depleting the space charge zone in the epitaxial layer at the periphery of the metal layer. This depletion is obtained by implanting ions counter balancing the initial doping of the epitaxial layer.

5 Claims, 9 Drawing Figures

METHOD OF MAKING SCHOTTKY DIODE WITH AN IMPROVED VOLTAGE BEHAVIOR

BACKGROUND OF THE INVENTION

The present invention relates to a process for producing a Schottky diode, particularly of the type comprising an epitaxial layer supporting an oxide layer, a metal layer establishing the Schottky contact and a metal guard ring.

In the field of semiconductor components it is known to use, particularly in detection or mixer high-frequency circuits, Schottky diodes formed by a contact of a metal with a weakly doped semiconductor which presents rectifying properties. However a disadvantage of such diodes resides in the fact that in numerous applications their voltage behaviour is an important limiting factor.

In FIG. 1, accompanying the present application, there is shown a schematical sectional view of a Schottky diode formed at the level of a monocrystalline n-type silicon layer 2 and on the top of which is disposed a metal layer 3. Reference 4 designates the silicon oxide layer $SiO_2$. Now the region 1, which forms the space charge zone, possesses, at the level of the periphery of the diode, a small radius of curvature and there results therefrom a high electric field which frequently causes premature breakdown of the diode. This field and the current in the diode are also very sensitive to surface effects.

In the prior art, a first solution shown in FIG. 2 accompanying the present application, consisted in using a guard ring 5 formed by diffusion, of type p, in the case of n-type silicon. In FIG. 2, the same references have been kept as those in FIG. 1 to designate similar elements. In this case, the result obtained is an extension of the space charge zone 6, with a more rounded shape at the edges of the Schottky diode, which improves the voltage behavior, but from a certain level a current finishes by flowing in the parasite junction diode formed by the guard ring and which may store charge carriers under certain conditions of polarization, and the result is a high switching time.

It was then proposed (FIG. 3), to avoid any storage of minority carriers and to eliminate the passage of the parasite current, to put in place two guard rings 7, 8 one of $n^+$ type the other of $p^+$ type, forming two junctions disposed head-to-tail. This arrangement certainly increases the extent of the space charge zone, which takes on the shape 9, but, apart from the fact that this solution is fairly complex, it causes the increase in the area of the element, which is detrimental to obtaining a high integration density of the circuits.

Finally another solution was proposed according to which an improvement in voltage behavior is obtained by means of a metal guard ring 10 (FIG. 4) deposited on the chamfered periphery of the oxide $SiO_2$ 4. By giving this ring 10 a special shape, such as shown, the electric field is reduced at the edges of the diode, which improves the voltage behavior. The space charge zone is designated in this case by the reference 11. Nevertheless, it turns out that the results depend on the profile of the guard ring and that the limitation comes from the periphery.

In the three known solutions for improving the voltage behavior of Schottky diodes, this voltage behavior remains however mediocre in quality; the characteristic of the diode is far from being ideal and there is associated therewith, furthermore, in the first two known solutions, parasite elements of the capacity, storage diode type, etc.

SUMMARY OF THE INVENTION

To resolve this problem, the invention uses the known fact, according to which the space charge zone is more extensive the weaker the doping, and uses this principle in a particular way by achieving a depletion of the space charge zone at the level of the periphery of the diode, and this particularly in the case of a Schottky diode having a metal guard ring, which further increases the performances of such a diode, and this without adding parasite elements such as indicated above.

This problem is resolved in accordance with the invention because it consists in depleting the space charge zone on the periphery of the diode by locally modifying the doping of the epitaxial layer. According to the invention this local modification of the doping of the epitaxial layer is carried out until the doping of this layer is counterbalanced, and this by implanting boron ions.

Other characteristics for implementing the process of the invention will become clear from the description given herebelow.

By way of example there is described below and illustrated schematically in the accompanying drawings one embodiment of the process of the invention.

DESCRIPTION OF THE PREFERRED EMBODIMENT

Figure 1:
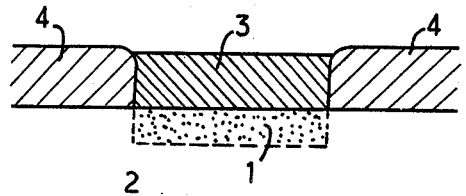
FIGS. 1 to 4, which have already been mentioned, illustrate the prior art in the field of Schottky diodes.
Figure 2:
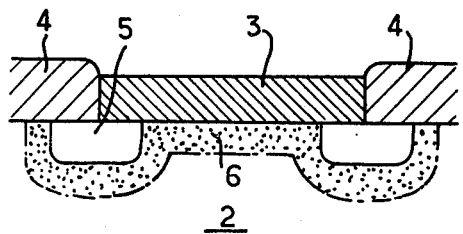
Figure 3:
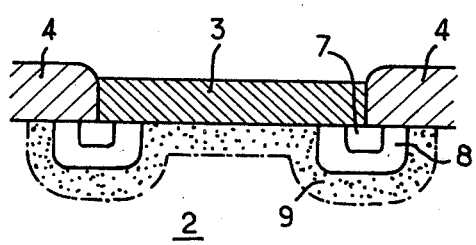
Figure 4:
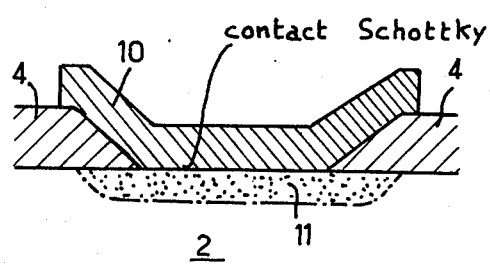
Figure 5:
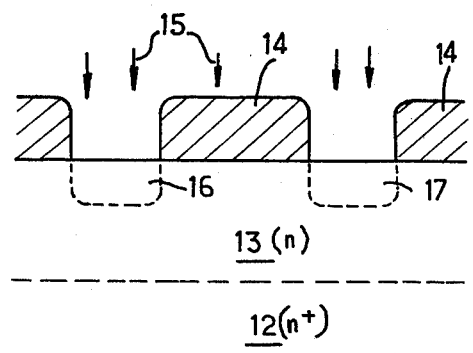
FIGS. 5 to 9 illustrate the different phases of implementing the process of the invention, in the case of a Schottky diode of the type with a metal guard ring.
Figure 6:
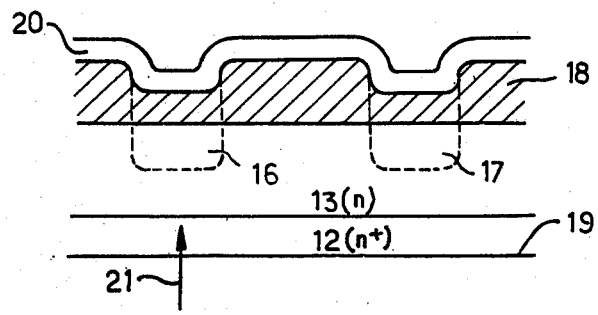
Figure 7:
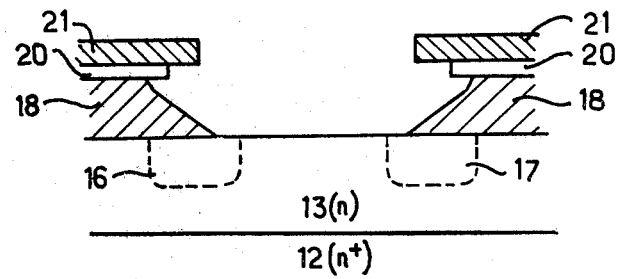

To put the process into practice, a heavily doped silicon substrate 12 of type $n^+$ is taken and an epitaxial layer 13 of type n is deposited thereon, then an oxide layer $SiO_2$ 14. After masking, implantation of boron ions (arrows 15) is carried out in accordance with the invention to provide local compensation of the doping of the epitaxial layer in zones 16 and 17, but without changing the type of doping (FIG. 5). Then, a new layer 18 of $SiO_2$ is deposited and, furthermore, the rear face 19 of the structure (FIG. 6) is deoxidized so that, during subsequent formation of a layer 20 of $SiO_2$ doped with phosphorous ($SiO_2$—$P_2O_5$), there will be produced diffusion of the phosphorous (arrow 21), thus creating a trapping network for the metal impurities. Then said layer 20 is deposited, then a photosensitive resin 21 well known under the name of "photoresist" is deposited, which is illuminated, after interpositioning an appropriate mask. Then the illuminated zones are dissolved, and finally a chamfered structure of oxide 18 is formed according to a conventional technique based on a difference of etching speed in oxide 18 and in the doped oxide layer 20 (FIG. 7). This chamfered form of the oxide layer above zones 16 and 17 is required to obtain progressive variation of the surface electric field and progressive depletion of the space charges in the epitaxial layer.

Figure 8:
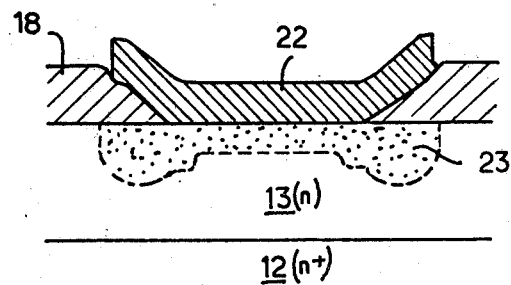

In accordance with the invention, the doping at the level of the Schottky contact is then adjusted by means of an implantation for perfectly defining what is called the Schottky barrier height and which is a parameter coming into the formula giving the current passing through the diode. Then an appropriate metal 22 is deposited on the structure and etched, as shown in FIG. 8, forming both the metal of the Schottky contact and a guard ring, the space charge zone obtained 23 having the form shown. It can be clearly seen that this zone is more extensive than in the case of the devices of the prior art and presents two swollen parts in zones 16, 17 at the level of the periphery of the Schottky contact.

Figure 9:
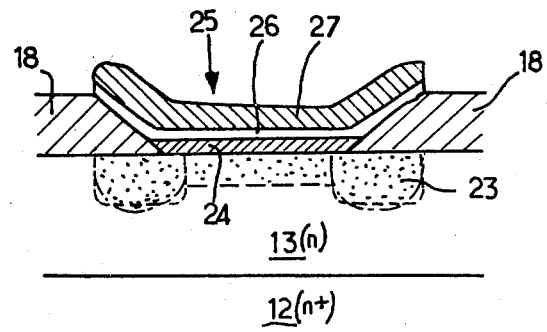

Furthermore, after having deposited the metal, one can cause it to react with the silicon by means of heat treatment to obtain a metal silicide and the excess metal is then eliminated. Then there is deposited (FIG. 9) on the silicide 24, a sandwich 25 comprising a refractory metal 26 acting as metal diffusion barrier and an interconnection metal 27. After etching, the device shown in the figure is obtained.

In accordance with the object of the invention, the local compensation of the initial doping of the epitaxial layer ensures a much greater extension of the space charge zone in the compensated zones than could be obtained with a single metal guard ring and an improvement in the voltage behavior of the diode is consequently obtained without addition of parasite elements such as capacities or carrier storage.

It is apparent that within the scope of the invention, modifications and different arrangements can be made other than are here disclosed. The present disclosure is merely illustrative with the invention comprehending all variations thereof.

What is claimed is:

1. A process for improving the behaviour under voltage of a Schottky diode, comprising an epitaxial layer doped according to a first conductivity type, a metal layer establishing the Schottky contact with a surface portion of the epitaxial layer and a metal guard ring on a chamfered insulating layer at the periphery of the surface portion, said process consisting in depleting the space charge zone at the periphery of the diode by local reduction of the doping level of the epitaxial layer, while maintaining the same conductivity type.

2. The process as claimed in claim 1, wherein, after masking the n-type epitaxial layer deposited on a substrate of type n+, local reduction of the initial doping of the epitaxial layer is carried out by implantation of boron ions.

3. The process as claimed in claim 2, wherein the initial doping of the n-type epitaxial layer is first counterbalanced locally, then there is deposited on the assembly an oxide layer ($SiO_2$), whose upper part is doped, and in which an aperture is formed whose edge has a chamfered profile, the doping at the level of the Schottky contact is adjusted by implantation of ions for defining perfectly the Schottky barrier height, and then an appropriate metal is deposited on the entire structure at the level of the contact.

4. The process as claimed in claim 3, wherein, during deposition of the metal at the Schottky contact, a metal guard ring is simultaneously deposited covering the periphery of the contact and continuous with the metal of the contact.

5. The process as claimed in one of claims 3 or 4, wherein, before surface doping the oxide layer, the rear face of the structure is deoxidized so that, during subsequent surface doping there occurs diffusion of the phosphorous forming a trapping network for metal impurities.

* * * * *